(12) United States Patent
Luo et al.

(10) Patent No.: US 8,859,336 B2
(45) Date of Patent: Oct. 14, 2014

(54) METHOD OF PACKAGING SEMICONDUCTOR DIE WITH CAP ELEMENT

(75) Inventors: Junhua Luo, Tianjin (CN); Zhigang Bai, Tianjin (CN); Nan Xu, Tianjin (CN); Jinzhong Yao, Tianjin (CN)

(73) Assignee: Freescale Semiconductor, Inc., Austin, TX (US)

( * ) Notice: Subject to any disclaimer, the term of this patent is extended or adjusted under 35 U.S.C. 154(b) by 259 days.

(21) Appl. No.: 13/398,816

(22) Filed: Feb. 16, 2012

(65) Prior Publication Data

US 2012/0238058 A1    Sep. 20, 2012

(30) Foreign Application Priority Data

Mar. 18, 2011   (CN) .......................... 2011 1 0065715

(51) Int. Cl.
*H01L 21/50* (2006.01)
*H01L 23/433* (2006.01)
*H01L 23/31* (2006.01)
*H01L 23/16* (2006.01)
*H01L 23/00* (2006.01)
*H01L 23/552* (2006.01)
*H01L 21/56* (2006.01)

(52) U.S. Cl.
CPC .......... *H01L 21/568* (2013.01); *H01L 23/4334* (2013.01); *H01L 23/3128* (2013.01); *H01L 21/565* (2013.01); *H01L 2924/15311* (2013.01); *H01L 2224/32245* (2013.01); *H01L 21/561* (2013.01); *H01L 2224/48247* (2013.01); *H01L 2224/73265* (2013.01); *H01L 23/16* (2013.01); *H01L 24/97* (2013.01); *H01L 2224/97* (2013.01); *H01L 23/552* (2013.01)
USPC .......................................... 438/111; 438/112

(58) Field of Classification Search
CPC .......................... A01B 12/006; H01L 21/2924
USPC ................................................. 438/111, 112
See application file for complete search history.

(56) References Cited

U.S. PATENT DOCUMENTS

6,917,097 B2    7/2005   Chow et al.
2007/0278632 A1  12/2007   Zhao et al.

*Primary Examiner* — Alexander Ghyka
(74) *Attorney, Agent, or Firm* — Charles Bergere (57) ABSTRACT

A method of assembling semiconductor devices includes placing an array of semiconductor dies on a die support. A cap array structure is provided that has a corresponding array of caps supported by a cap frame structure. The cap array structure and the array of semiconductor dies on the die support are aligned, with the caps extending over corresponding semiconductor dies, in a mold chase. The array of semiconductor dies and the array of caps are encapsulated with a molding compound in the mold chase. The encapsulated units of the semiconductor dies with the corresponding caps are removed from the mold chase and singulated. Singulating the encapsulated units may include removing the cap frame structure from the encapsulated units.

16 Claims, 7 Drawing Sheets

METHOD OF PACKAGING SEMICONDUCTOR DIE WITH CAP ELEMENT

BACKGROUND OF THE INVENTION

The present invention is directed to a method of assembling a semiconductor device and, more particularly, to a method of packaging a shielded semiconductor die with a cap element.

Semiconductor device packaging fulfills basic functions such as providing electrical connections and protecting the die against mechanical and environmental stresses. The completed semiconductor device may be mounted on a support with electrical connectors, such as a printed circuit board ('PCB'). The semiconductor device may have exposed external electrical contact surfaces or leads for connection to the electrical connectors on the support. Using surface mount technology, external electrical contact surfaces or leads of the package can be soldered directly to corresponding pads on the support, providing mechanical attachment as well as electrical connections.

Semiconductor devices are commonly packaged for surface mounting by encapsulating one or more semiconductor dies, the encapsulation process including embedding the die or dies in a molding compound. Various techniques are available for connecting the external electrical contact surfaces or leads of the package internally with electrical contact pads on the embedded semiconductor die.

In a wire bonded package, the semiconductor die may be mounted on a die support with the contact pads of the semiconductor die on its active face opposite from the die support. Wires are bonded to the contact pads of the semiconductor die and to the external electrical contact surfaces or leads of the package to provide the internal connections, before encapsulation.

In a lead frame base package, the die support is an electrically conductive lead frame, whose frame members are cut off and discarded during production, to isolate the electrical contact surfaces or leads of the package from each other, after applying molding compound to embed and support the semiconductor die, the internal connections and the external electrical contacts from the lead frame. This technique is limited to devices where the external electrical contacts of the package are disposed around the periphery of the semiconductor die, either in active faces of the finished device or at edges of the device.

In a laminate or ceramic base package, the die support is an electrically insulating substrate bearing the external electrical contact surfaces. Examples of laminate base packages include ball grid array ('BGA'), pin grid array ('PGA') and land grid array ('LGA') packages. In one technique of laminate base packages, before encapsulation, internal connections are made by wire bonding between the contact pads of the semiconductor die and the external electrical contact surfaces. After encapsulation, an array of solder balls or studs may be applied to the external electrical contact surfaces, typically before singulation of the encapsulated devices. In place of the balls or pins, LGA packages have metal pads that are contacted by pins on the PCB.

In another example of a laminate base package using a flip-chip technique, the die support is a temporary substrate that is removed after encapsulating the array of semiconductor dies. The contact pads of the semiconductor die on its active face are metallized and solder balls or studs are applied to the contact pads, typically before singulation. The singulated dies are then placed with their active face on a printed circuit board or other substrate bearing an array of corresponding external connectors. The solder is then re-melted (called reflow), typically using an ultrasonic or a reflow solder process to establish the electrical connections. This technique requires the same identical geometry for the array of contacts for the external connectors as for the array of contact pads on the semiconductor die.

In a variant of the flip-chip BGA technique known as 'redistributed chip packaging' (RCP), redistributing connections are made between the pads on the die surfaces and external contact pads in an electrically insulating substrate at the surface of the package to reroute the signals, power and ground connections. The redistribution process may include deposition of a plurality of electrically conductive layers by electroplating techniques, separated by insulating layers and patterned using batch process lithography. An array of solder balls or studs is applied to the external contact pads in the electrically insulating layers.

A semiconductor device may have a cap extending over one face of the semiconductor die or dies. Such a cap may be formed of a thermally conductive material and function as a heat sink, distributing internally generated heat over the face of the semiconductor die or dies and dissipating the heat, by conduction radiation and/or convection, for example. In another example, such a cap may be formed of an electrically conductive material and function as an electromagnetic shield element in order to reduce electromagnetic interference effects. In yet another example, a cap may be formed of a material of high magnetic permeability and function as a magnetic shield element against static or slowly varying magnetic fields.

Integrating the cap in the semiconductor device may involve extra process steps, increasing the cost of the device and introducing additional risks of manufacturing defects.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

DETAILED DESCRIPTION OF PREFERRED EMBODIMENTS

Figure 1:
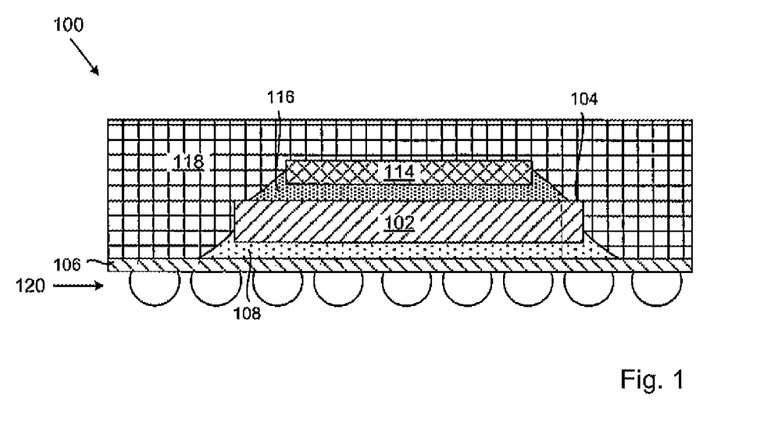
FIG. 1 is a schematic detailed section along line 1-1 of FIG. 2 of a known BGA device.
Figure 2:
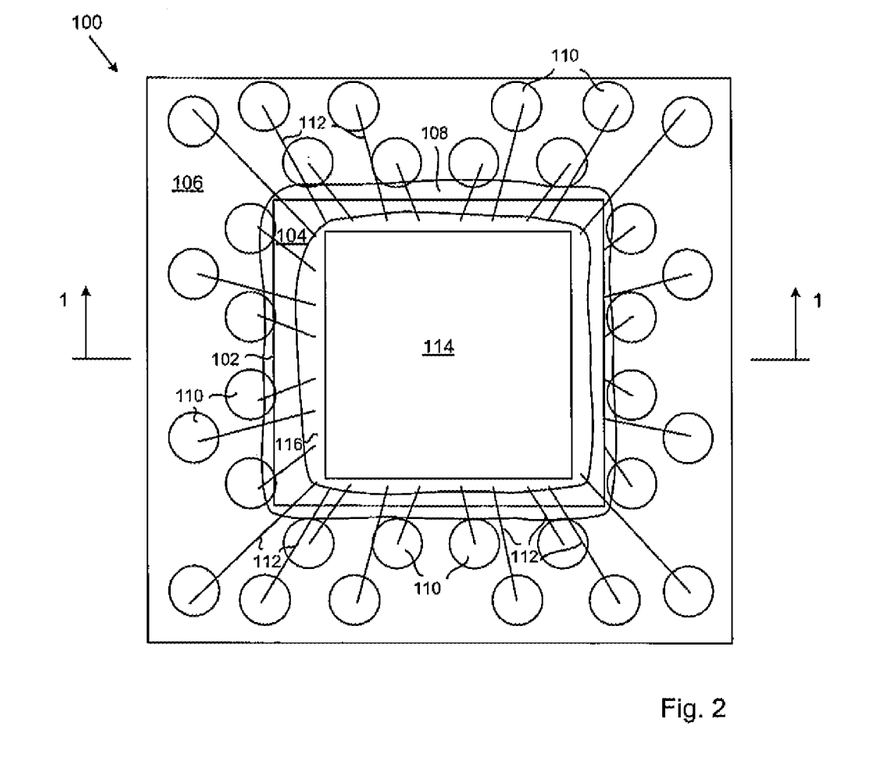
FIG. 2 is a schematic plan view of the known BGA device of FIG. 1 at an intermediate stage in production.
Figure 3:
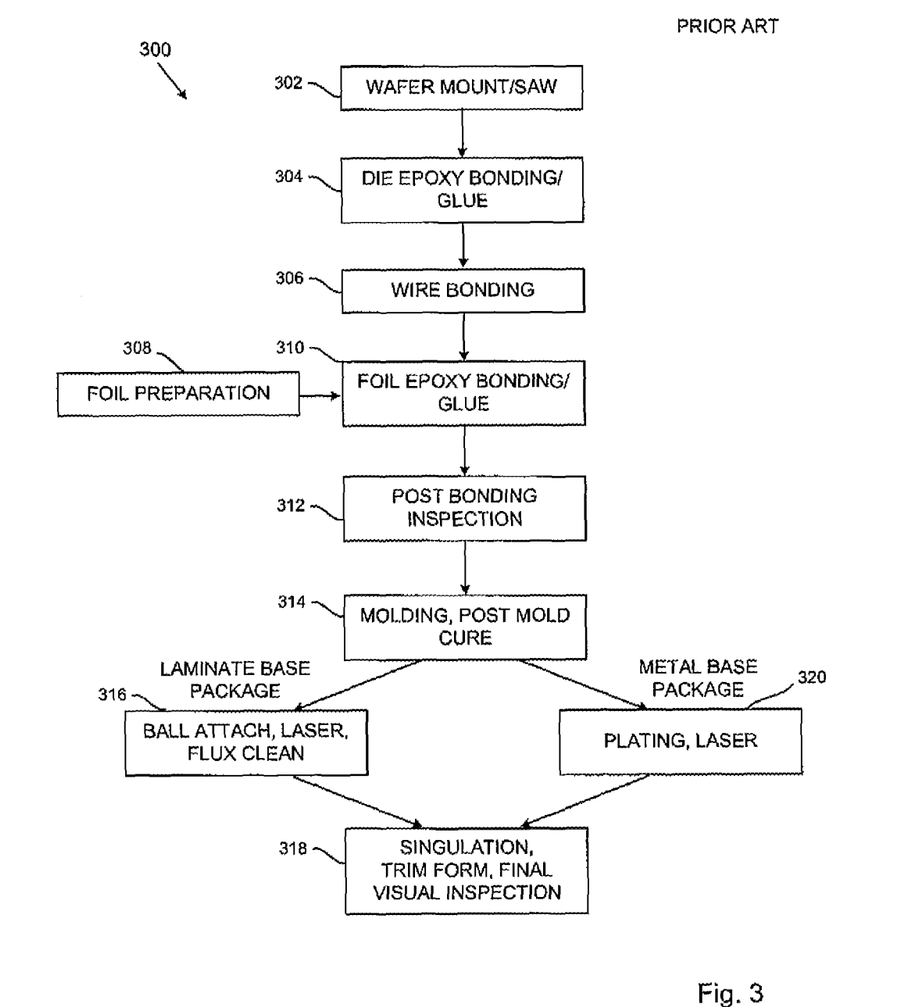
FIG. 3 is a simplified flow chart of the stages in a known method of producing the BGA device of FIGS. 1 and 2.

FIGS. 1 to 3 illustrate a known method of making semiconductor devices with cap elements. In this example the semiconductor devices are ball grid array ('BGA') devices connected internally by wire bonding. The semiconductor device 100 shown in FIG. 1 comprises a semiconductor die 102 having an active face 104 bearing contact pads (not shown). The semiconductor die 102 is mounted with its face opposite the active face 104 fixed to an electrically insulating die support 106 by epoxy bonding or glue 108, for example. The die support 106 also comprises an array of external electrical contact surfaces 110. As shown in FIG. 2, before encapsulation, internal connections are made by bonding wires such as 112 between the contact pads of the semiconductor die and the external electrical contact surfaces such as 110.

The semiconductor device 100 also comprises a cap element 114. In the known method of making semiconductor devices illustrated in FIGS. 1 to 3, the cap element 114 comprises a sheet of foil which is picked and placed on the active face 104 of the semiconductor die 102 and attached by epoxy bonding or glue 116, for example. In this example, the semiconductor die 102 comprises a magneto-resistive random access memory ('MRAM') module, which is sensitive to external static or slowly varying magnetic fields. The cap element is in high permeability magnetic material, such as an NiFe alloy. An array of the semiconductor dies 102 are encapsulated in a molding compound 118, an array of solder balls 120 is applied to the external electrical contact surfaces 110, and the semiconductor devices are then singulated.

FIG. 3 shows a summary of an example of a method 300 of making the semiconductor devices 100. In the method 300, a wafer containing an array of semiconductor dies 102 is mounted and singulated at 302, by sawing for example. At 304, the individual semiconductor dies 102 are picked and fixed in an array on the electrically insulating die support 106 by epoxy bonding or glue 108. At 306, internal connections are made by bonding wires such as 112 between the contact pads of the semiconductor dies and the external electrical contact surfaces such as 110, resulting in the incomplete structure as shown in FIG. 2 for one semiconductor device. It will be understood that the wire bonding step 306 would be omitted in the case of a flip-chip package.

At 308, the foil of the cap elements 114 is prepared for bonding by surface treatment, trimming to size, picking and placing. At 310, the individual foil elements 114 are fixed to the active faces 104 of the semiconductor dies 102 by epoxy bonding or glue 116, for example. At 312 there is a post-bond inspection. At 314, the array of semiconductor dies 102 with the bonding wires 112 and cap elements 114 are encapsulated in a mold chase (not shown) with a molding compound 118 and the molded assembly is subjected to a post molding cure. At 316, for a BGA package, the array of solder balls 120 is applied to the external electrical contact surfaces 110. The semiconductor devices are then singulated at 318 and trimmed followed by final visual inspection.

In a variant of the method 300, applicable to lead frame semiconductor devices, the method is similar, except that at the step 304 the individual semiconductor dies 102 are picked and fixed in an array on the lead frame structure and that the step 316 may be replaced by a plating and laser treatment operation 320 for the lead frame.

FIGS. 4 to 20 illustrate examples of a method of making semiconductor devices in accordance with an embodiment of the present invention. The method comprises placing an array of semiconductor dies on a die support. A cap array structure is provided comprising a corresponding array of cap elements supported by a cap frame structure. The cap array structure and the array of semiconductor dies on the die support are positioned in alignment, with the cap elements extending over corresponding semiconductor dies, in a mold chase. The array of semiconductor dies and the array of cap elements are encapsulated with a molding compound in the mold chase. The encapsulated units of the semiconductor dies with the corresponding cap elements are singulated.

Singulating the encapsulated units may include removing the cap frame structure from the encapsulated units.

Figure 4:
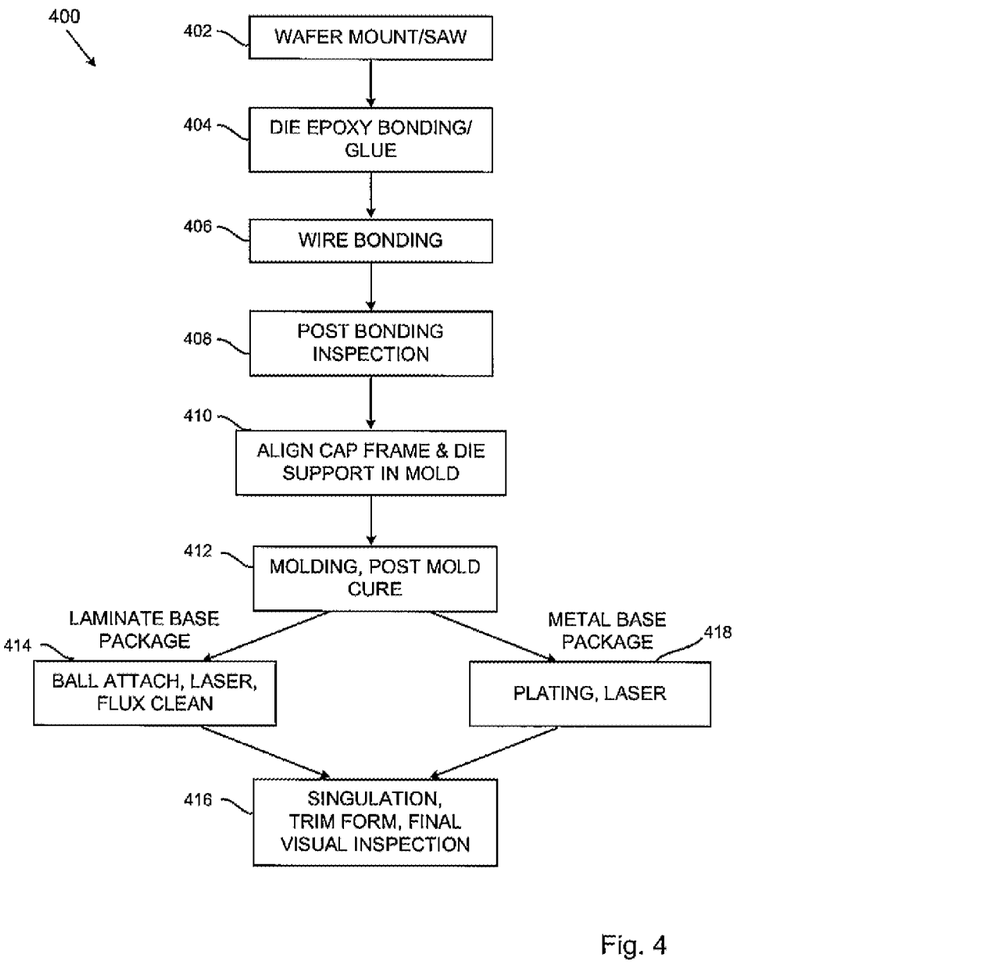
FIG. 4 is a simplified flow chart of the stages in a method of assembling a semiconductor device in accordance with one embodiment of the invention, given by way of example.

FIG. 4 shows a summary similar to FIG. 3 of an example of a method 400 of making semiconductor devices using wire bonding in accordance with an embodiment of the present invention. In the method 400, a wafer containing an array of semiconductor dies 102 is mounted and singulated at 402, by sawing for example. At 404, individual semiconductor dies 102 are picked and fixed in an array on an electrically insulating die support 106 by epoxy bonding or glue 108. At 406, internal connections are made by bonding wires such as 112 between contact pads of the semiconductor dies and the external electrical contact surfaces such as 110.

The cap array structure may be manufactured by similar methods to the manufacture of lead frame structures and, depending on their function, may be made of similar materials as those used in lead frame structures. Accordingly, the cap array structure may be supplied by the same sources as typically supply lead frame structures. At 408, there is a post bond inspection. The cap array structure and the die support 106 are aligned in a mold chase at 410. At 412, the array of semiconductor dies 102 with the bonding wires 112 and cap elements 114 are encapsulated in a mold chase with a molding compound 118 and the molded assembly is subjected to a post molding cure. At 414, for a BGA package, the array of solder balls 120 is applied to the external electrical contact surfaces 110, and the semiconductor devices are then singulated at 416 and trimmed, followed by final visual inspection. The method avoids handling individual cap elements 114 as at step 308 and avoids the additional step 310 of bonding the cap elements 114.

In a variant of the method 400, applicable to lead frame semiconductor devices, the method is similar, except that at the step 404 the individual semiconductor dies 102 are picked and fixed in an array on the lead frame structure and that the step 414 is replaced by a plating and laser treatment operation 418 for the lead frame. The steps 402 to 406 of the method 400 may be similar to the steps 302 to 306 of the known method 300.

Figure 5:
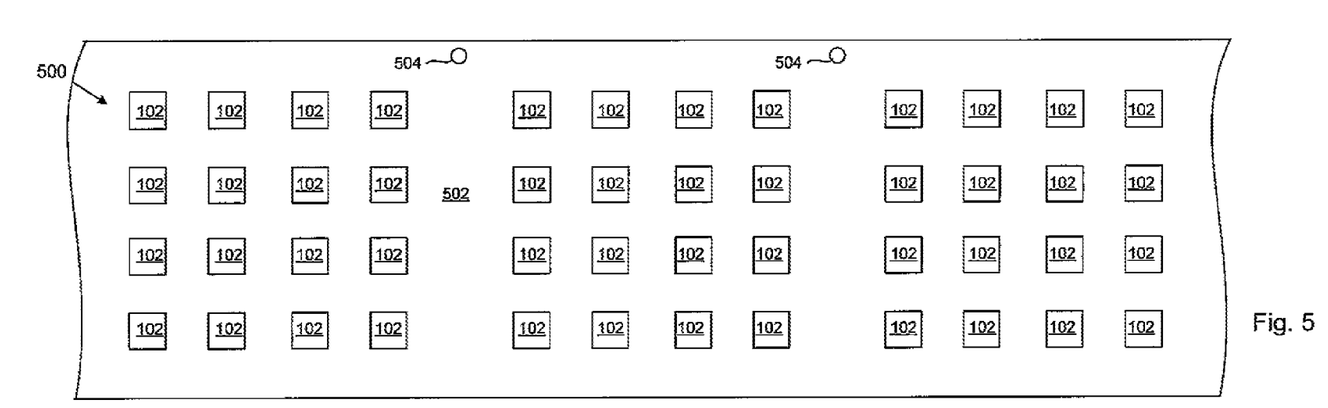
FIG. 5 is a schematic plan view of an array of semiconductor dies on a die support at a stage in one example of the method of assembling a semiconductor device of FIG. 4.

FIGS. 5 to 11 illustrate an example of another variant of the method 400 applicable to flip-chip BGA semiconductor devices, without wire bonding. In the method illustrated in FIGS. 5 to 11, semiconductor dies 102 are picked and placed in an array 500 on a die support 502, comprising a temporary substrate, as shown in FIG. 5. The die support 502 comprises alignment holes 504 for cooperating with location pins in the encapsulation mold. A detail of one of the semiconductor dies 102 on the die support 502 is shown in sectional view at enlarged scale in FIG. 8.

Figure 6:
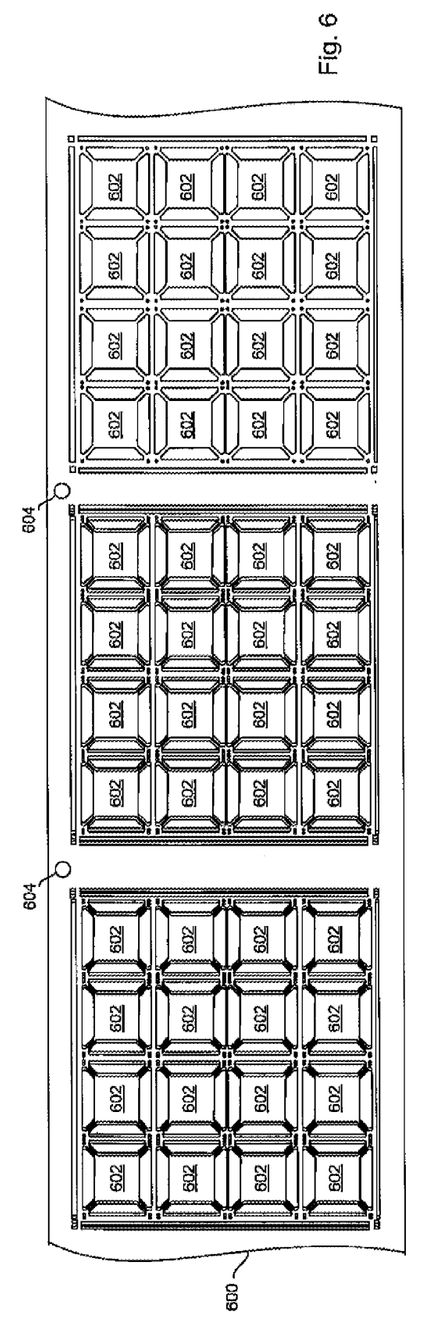
FIG. 6 is a schematic plan view of a cap array structure used with the array of semiconductor dies of FIG. 5 at a stage in the assembly process.

FIG. 6 shows a cap array structure 600 used with the array of semiconductor dies on the die support 502 of FIG. 5. The cap array structure 600 comprises an array of cap elements 602 supported by a cap frame structure. The array of cap elements 602 is of similar geometry to the array 500 of semiconductor dies 102 on the die support 502. The cap array structure 600 comprises alignment holes 604 similarly positioned and sized to the alignment holes 504 for cooperating with the location pins in the mold chase to ensure alignment of the array 500 of semiconductor dies 102 on the die support 502 relative to the cap array structure 600 in the mold chase.

Figure 7:
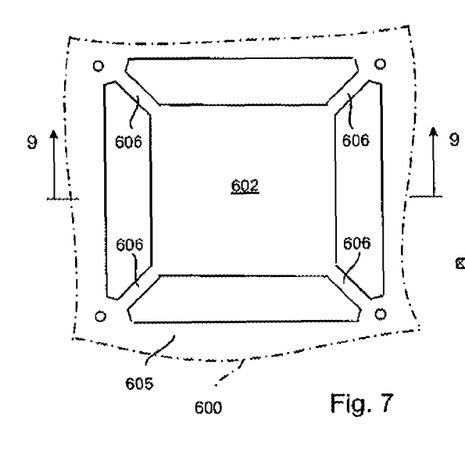
FIG. 7 is an enlarged plan view of a cap in the cap frame structure of FIG. 6 at a stage in the assembly process.
Figure 8:
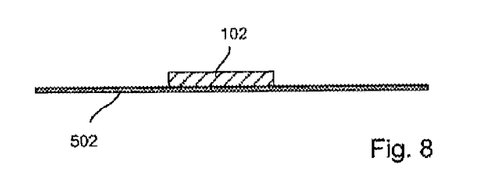
FIGS. 8 to 11 are sectional views of elements of the semiconductor device at various stages during an example of the method illustrated in FIGS. 5 to 7 of assembling a semiconductor device in accordance with an embodiment of the present invention.
Figure 9:
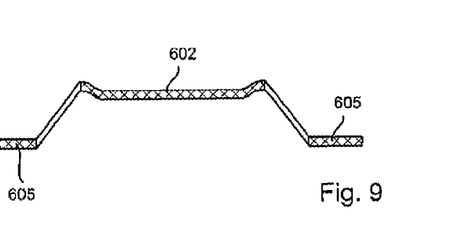

A detail of one of the cap elements 602 in the cap array structure 600 is shown at enlarged scale in FIG. 7 in plan view and in sectional view along the line 9-9 in FIG. 9. The cap array structure 600 includes a cap frame structure comprising frame members forming rectangular frames 605, in this case square, surrounding the cap elements 602, the frame members being common to adjacent cap elements 602. The cap elements 602 are connected mechanically with the rectangular frames 605 by ties 606 at each corner of the rectangular frames 605, so that the rectangular frames 605 and ties 606 support the cap elements 602 until the encapsulation step 412. The ties 606 are inclined to the plane in which the rectangular frames 605 extend, so that the cap elements 602, which extend generally parallel to that plane, are offset from the plane and are spaced from the semiconductor dies 102 when the cap array structure 600 is assembled with the semiconductor die array 500 with the rectangular frames 605 abutting the die support 502, as shown in FIG. 10.

Figure 10:
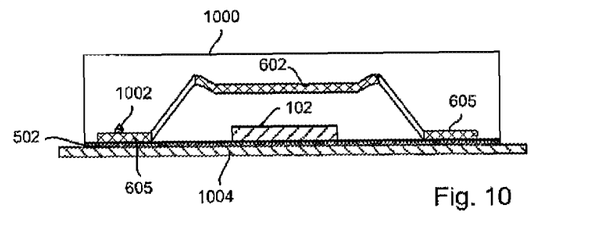

FIG. 10 shows schematically an encapsulation mold chase 1000 with one of the location pins 1002 engaged in the alignment holes 504 and 604, the mold chase 1000 being closed by a backing plate 1004 engaging the temporary substrate forming the die support 502. At the step 412 of the method 400, when molding compound is introduced into the mold chase 1000, it can flow through the gaps between the ties 606 at the corners of the rectangular frames 605 and into the spaces between the cap elements 602 and the semiconductor dies 102 left by the offset of the cap elements 602 from the semiconductor dies 102 and the die support 502 to complete the encapsulation of the semiconductor devices under the cap elements 602.

Figure 11:
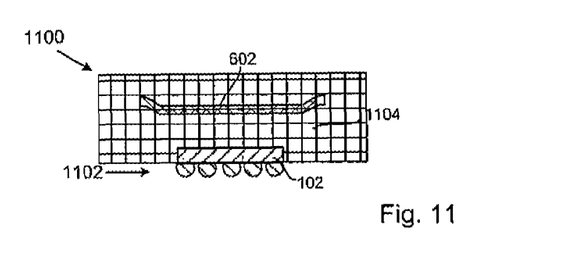

FIG. 11 shows the semiconductor device 1100 after the step 414 of attachment of the ball array 1102 and the step 416 of singulation. Once the device 1100 is encapsulated, the molding compound 1104 supports the semiconductor dies 102 independently of the die support 502, which is removed. The molding compound 1104 also supports the cap elements 602 independently of the ties 606 (which are also embedded but are hidden by the molding compound 1104 in FIG. 11) and the rectangular frames 605, and the rectangular frames 605 can be removed and discarded. Removing the rectangular frames 605 is conveniently achieved during singulation, for example by the singulation process passing a singulation saw along saw streets so as to cut off the frame members from the corresponding cap elements 602 and semiconductor dies 102.

The cap elements 602 are enclosed within the molding compound 1104 in this example, but may be left exposed at the surface of the device.

FIGS. 12 to 20 illustrate an example of another variant of the method 400 applicable to lead frame semiconductor devices, with wire bonding. In the method illustrated in FIGS. 12 to 20, semiconductor dies 102 are picked and placed in an array 1200 on a die support 1202, shown in FIG. 12. The die support 1202 is a lead frame structure, which comprises alignment holes 1204 for cooperating with location pins in the encapsulation mold chase. A detail of one of the elements of the lead frame die support 1202 is shown at enlarged scale in FIG. 14 in plan view and in sectional view along the line 16-16 in FIG. 16. The lead frame structure 1202 includes flags or pads 1206 onto which individual semiconductor dies are placed and bonded at step 404. The lead frame structure 1202 also includes a supporting frame structure comprising frame members surrounding the flags 1206 and forming rectangular frames 1208, in this case square, surrounding the flags 1206, the frame members being common to adjacent flags 1206. The frame members are formed integrally, by stamping for example, with sets of electrical contacts 1210, which are exposed at the sides of the active face of the finished semiconductor device. The sets of external electrical contacts 1210 project inwards towards the flags 1206 from the inside edges of the rectangular frames 1208. The rectangular frames 1208 will be cut off and removed after encapsulation, in this example during singulation 416. The sets of external electrical contact surfaces or leads are disposed peripherally to the flags 1206, on two opposite sides ('dual in-line package') or on all four sides ('quad package'). The example illustrated is a 'quad flat no-lead' ('QFN') package, in which the external electrical contact surfaces are exposed in the active face 2004 and in the sides of the finished device 2000. A similar configuration is applicable to a dual in-line flat no-lead package. It will be appreciated that the example illustrated may be adapted to a quad flat package ('QFP') in which the external electrical contact surfaces are leads extending beyond the sides of the finished device 2000 and typically are not coplanar with the active face 2004.

Figure 14:
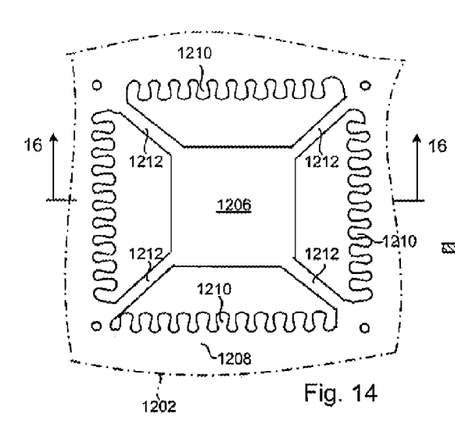
FIG. 14 is an enlarged schematic plan view of an individual lead frame in the lead frame structure of FIG. 12 at a stage in assembling a semiconductor device in accordance with an embodiment of the present invention.
Figure 16:
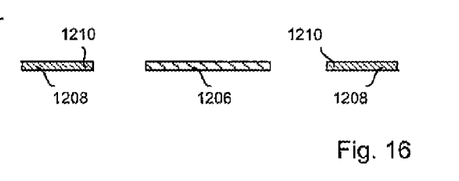
FIGS. 16 to 20 are sectional views of elements of the semiconductor device at various stages during an example of the method illustrated in FIGS. 12 to 15 of assembling a semiconductor device in accordance with an embodiment of the present invention.

The flags 1206 are connected mechanically with the rectangular frames 1208 by ties 1212 at each corner of the rectangular frames 1208, so that the rectangular frames 1208 and ties 1212 support the flags 1206 until the encapsulation step 412. In this example, the ties 1212 are coplanar with the flags 1206 and the rectangular frames 1208, so that the flags 1206 are exposed in the active face of the finished semiconductor device. In another example of embodiments of the present invention, the ties 1212 are inclined relative to the flags 1206 and the rectangular frames 1208, so that the flags 1206 are embedded under the active face of the finished semiconductor device. In yet another example of embodiments of the present invention, the ties 1212 and the flags 1206 are omitted, the semiconductor dies 102 being mounted on the external electrical contacts 1210.

Figure 12:
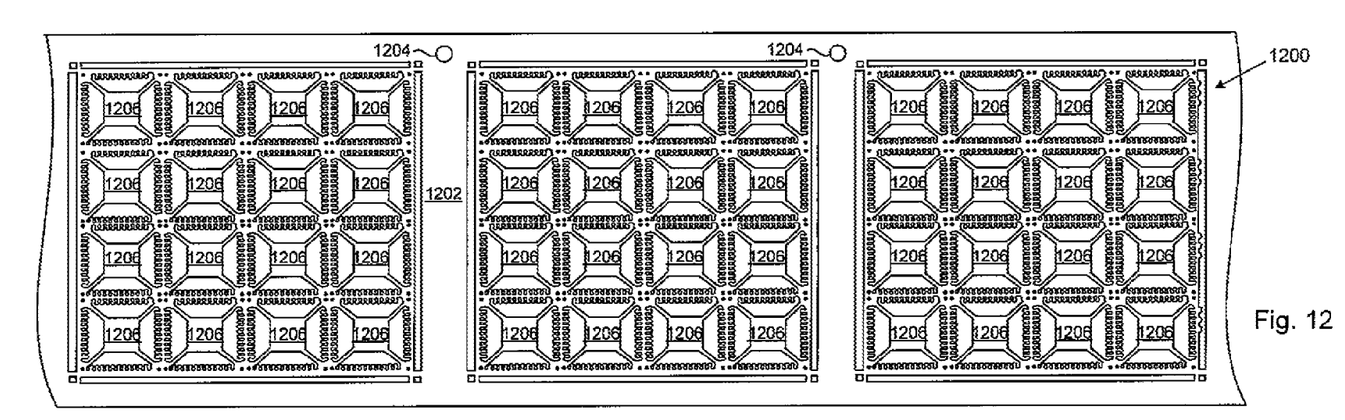
FIG. 12 is a schematic plan view of a lead frame structure for an array of semiconductor dies at a stage in another example of the method of assembling a semiconductor device of FIG. 4.
Figure 13:
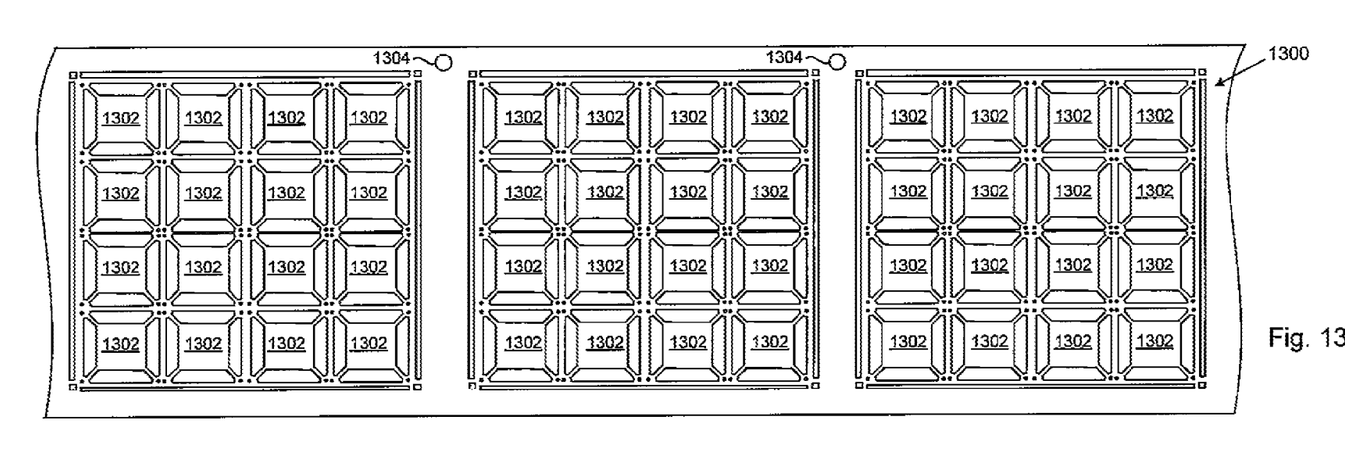
FIG. 13 is a schematic plan view of a cap frame structure used with the lead frame structure of FIG. 12 at a stage in assembling a semiconductor device in accordance with an embodiment of the present invention.

FIG. 13 shows a cap array structure 1300 used with the array 1200 of semiconductor dies on the die support 1202. The cap array structure 1300 comprises an array of cap elements 1302 supported by a cap frame structure. The array of cap elements 1302 is of similar geometry to the array 1200 of semiconductor dies 102 on the die support 1202. The cap array structure 1300 comprises alignment holes 1304 similarly positioned and sized to the alignment holes 1204 for cooperating with the location pins in the encapsulation mold chase to ensure alignment of the array 1200 of semiconductor dies 102 on the die support 1202 relative to the cap array structure 1300 in the encapsulation mold chase.

Figure 15:
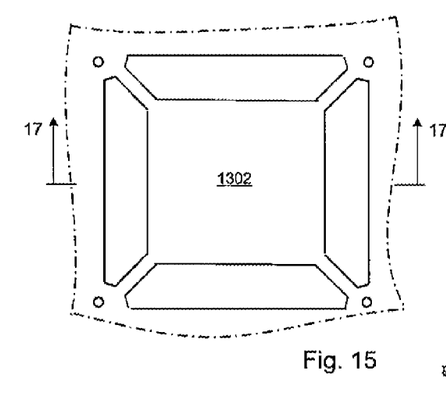
FIG. 15 is an enlarged schematic plan view of a cap in the cap frame structure of FIG. 13 at a stage in assembling a semiconductor device in accordance with an embodiment of the present invention.
Figure 17:
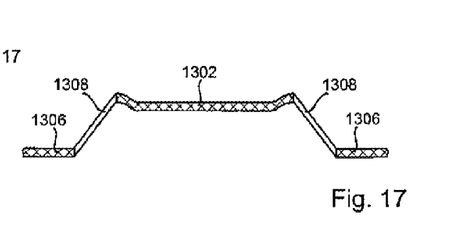
Figure 19:
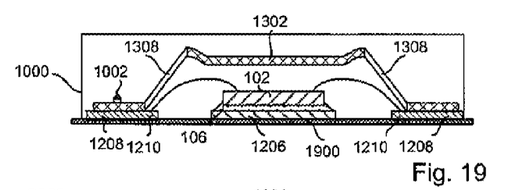

A detail of one of the cap elements 1302 in the cap array structure 1300 is shown at enlarged scale in FIG. 15 in plan view and in sectional view along the line 17-17 in FIG. 17. The cap array structure 1300 includes a cap frame structure comprising frame members forming rectangular frames 1306, in this case square, surrounding the cap elements 1302, the frame members being common to adjacent cap elements 1302. The cap elements 1302 are connected mechanically with the rectangular frames 1306 by ties 1308 at each corner of the rectangular frames 1306, so that the rectangular frames 1306 and ties 1308 support the cap elements 1302 until the encapsulation step 412. The ties 1308 are inclined to the plane in which the rectangular frames 1306 extend, so that the cap elements 1302, which extend generally parallel to that plane, are offset from the plane and are spaced from the semiconductor dies 102 and bonding wires when the cap array structure 1300 is assembled with the semiconductor die array 1200 with the rectangular frames 1306 of the cap array abutting the frames 1208 of the lead frame array, as shown in FIG. 19. The cap elements 1302 may be dished, as shown, so as to give extra clearance at their sides from the bonding wires, while maintaining proximity of the central part of the cap elements 1302 to the semiconductor dies 102 so as to maintain their interaction with the semiconductor dies.

Figure 18:
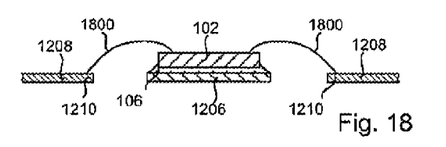

FIG. 18 shows schematically a semiconductor die 102 after mounting on one of the flags 1206 of the die support 1202, epoxy bonding or gluing 106 at the step 404, and connecting contact pads on the surface of the semiconductor die 102 opposite the flag 1206 to the sets of electrical contacts 1210 at the step 406 by bonding wires 1800.

FIG. 19 shows schematically an encapsulation mold chase 1000 with one of the location pins 1002 engaged in the alignment holes 1204 and 1304, the mold chase 1000 being closed by a plate 1900. At the step 412 of the method 400, when molding compound is introduced into the mold chase 1000, it can flow through the gaps between the ties 1308 at the corners of the rectangular frames 1306 and into the spaces between the cap elements 1302 and the semiconductor dies 102 left by the offset of the cap elements 1302 from the semiconductor dies 102 and the die support 1202 to complete the encapsulation of the semiconductor devices under the cap elements 1302.

Figure 20:
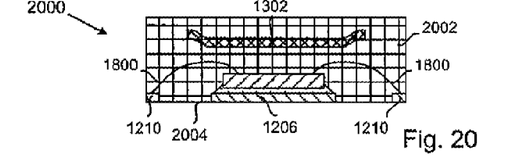

FIG. 20 shows the semiconductor device 2000 after the step 418 of plating and laser treatment and the step 416 of singulation. Once the device 2000 is encapsulated, the molding compound 2002 supports the semiconductor dies 102, the external contacts 1210 and the bonding wires 1800 independently of the rectangular frames 1208 of the die support 1202, which are removed and discarded. The molding compound 2000 also supports the cap elements 1302 independently of the ties 1308 and the rectangular frames 1306, and the rectangular frames 1306 can be removed and discarded. Removing the rectangular frames 1208 of the die support 1202 and the rectangular frames 1306 of the cap array structure is performed simultaneously in this example of an embodiment of the invention. The rectangular frames 1208 and the rectangular frames 1306 are conveniently removed during singulation, for example by the singulation process passing a singulation saw along saw streets so as to cut off the frame members from the corresponding flags 1206 and semiconductor dies 102 and the cap elements 1302. The cap elements 1302 are enclosed within the molding compound 1104 in this example, but may be left exposed at the surface of the device. The external contacts 1210 are exposed at the active face 2004 and sides of the finished device 2000 in this example.

The examples of embodiments of the present invention described above, in particular the method 400 and the methods illustrated in FIGS. 5 to 20, are applicable to making semiconductor devices in which the cap element fulfills different functions. For example, the cap element may be formed of a thermally conductive material and function as a heat sink, distributing internally generated heat over the face of the semiconductor die or dies and dissipating the heat, by conduction radiation and/or convection, for example. In another example, such a cap element may be formed of an electrically conductive material and function as an electromagnetic shield element; a flag of a lead frame structure of the same or a different electrically conductive material may form a complementary electromagnetic shield element on the opposite side of the semiconductor die or dies, in order further to reduce electromagnetic interference effects. In yet another example, such a cap element may be formed of a material of high magnetic permeability and function as a magnetic shield element against static or slowly varying magnetic fields.

In the foregoing specification, the invention has been described with reference to specific examples of embodiments of the invention. It will, however, be evident that various modifications and changes may be made therein without departing from the broader spirit and scope of the invention as set forth in the appended claims.

Terms like "front," "back," "top," "bottom," "over," and "under" in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A method of assembling semiconductor devices, comprising:
   placing an array of semiconductor dies on a die support, wherein said die support comprises a first set of alignment holes;
   providing a cap array structure including a corresponding array of cap elements supported by a cap frame structure, wherein said cap array structure comprises a second set of alignment holes;
   aligning said cap array structure and said array of semiconductor dies on said die support, wherein said cap elements extend over corresponding semiconductor dies, in a mold chase, wherein said mold chase includes location pins for positioning and aligning said cap array structure and said array of semiconductor dies on said die support using said first and second sets of alignment holes;

encapsulating said array of semiconductor dies and said array of cap elements with a molding compound; and singulating encapsulated units of said semiconductor dies and cap elements.

2. The method of claim 1, further comprising providing respective sets of external electrical contact surfaces connected to said semiconductor dies.

3. The method of claim 2, wherein said die support comprises a temporary substrate that is removed after encapsulating said array of semiconductor dies and said array of cap elements, and wherein providing respective sets of external electrical contact surfaces includes applying electrical contact surfaces to said encapsulated units after removing said temporary substrate.

4. The method of claim 2, wherein said die support comprises an electrically insulating substrate bearing said electrical contact surfaces.

5. The method of claim 2, wherein said respective sets of external electrical contact surfaces include respective ball grid arrays.

6. The method of claim 2, wherein said die support comprises a lead frame structure, and said lead frame structure includes said sets of external electrical contact surfaces and a supporting frame structure.

7. The method of claim 6, wherein singulating said encapsulated units includes removing said supporting frame structure from said encapsulated units.

8. The method of claim 6, wherein said lead frame structure includes an array of flags for receiving said array of semiconductor dies and supported initially by said supporting frame structure, wherein said sets of external electrical contact surfaces are disposed peripherally to said flags.

9. The method of claim 2, wherein said sets of external electrical contact surfaces are connected to said semiconductor dies by wires bonded to said external electrical contact surfaces and to said dies before positioning said cap array structure and said array of semiconductor dies in said mold chase.

10. The method of claim 1, wherein singulating said encapsulated units includes removing said cap frame structure from the encapsulated units.

11. The method of claim 1, wherein said cap array structure comprises thermally conductive material so that said cap elements act as heat sinks for said semiconductor dies.

12. The method of claim 1, wherein said cap array structure comprises electrically conductive material so that said cap elements provide electromagnetic shielding for said semiconductor dies.

13. The method of claim 1, wherein said semiconductor dies comprise magneto-resistive random access memories and said cap array structure comprises high permeability magnetic material so that said cap elements provide magnetic shielding for said semiconductor dies.

14. The method of claim 1, wherein said cap frame structure comprises cap frame members that form rectangular frames surrounding said cap elements respectively, the frame members being common to adjacent cap elements.

15. The method of claim 14, wherein said cap elements are connected mechanically with said rectangular frames by ties at each corner of the rectangular frames, so that said rectangular frames and said ties at least temporarily support said cap elements.

16. The method of claim 15, wherein said ties are inclined to a plane in which said rectangular frames extend, such that said cap elements are offset from said plane and are spaced from said semiconductor dies when said cap array structure is assembled with said array of semiconductor dies with said rectangular frames abutting said die support.

* * * * *